United States Patent
Hur et al.

(10) Patent No.: US 8,629,455 B2
(45) Date of Patent: Jan. 14, 2014

(54) POWER SEMICONDUCTOR DEVICE

(75) Inventors: Seung Bae Hur, Suwon-si (KR); Heon Bok Lee, Suwon-si (KR); Ki Se Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/560,823

(22) Filed: Jul. 27, 2012

(65) Prior Publication Data

US 2013/0026485 A1    Jan. 31, 2013

(30) Foreign Application Priority Data

Jul. 27, 2011   (KR) .................. 10-2011-0074686

(51) Int. Cl.
| H01L 31/0256 | (2006.01) |
| H01L 31/0328 | (2006.01) |
| H01L 31/0336 | (2006.01) |
| H01L 31/072  | (2012.01) |
| H01L 31/109  | (2006.01) |

(52) U.S. Cl.
USPC .................. 257/76; 257/194; 257/E29.089

(58) Field of Classification Search
USPC .................... 257/76, 194, E29.089
See application file for complete search history.

(56) References Cited

U.S. PATENT DOCUMENTS

| 6,593,603 B1* | 7/2003 | Kim et al. ............. 257/194 |
| 2007/0181934 A1 | 8/2007 | Hu et al. |
| 2013/0207121 A1* | 8/2013 | Kawanami et al. ....... 257/76 |

FOREIGN PATENT DOCUMENTS

| KR | 10-2005-0074280 A | 7/2005 |
| WO | WO 2008/155085 A1 | 12/2008 |

* cited by examiner

*Primary Examiner* — David S Blum

(74) *Attorney, Agent, or Firm* — McDermott Will & Emery LLP

(57) ABSTRACT

A power semiconductor device is provided. The power semiconductor device includes a source electrode disposed on a device activation region and widened in a direction toward a first side, a drain electrode arranged alternately with the source electrode on the device activation region and widened in a direction toward a second side facing the first side, an insulating layer disposed on the source electrode and the drain electrode and configured to include a plurality of via contacts contacting the source electrode and the drain electrode, a source electrode pad disposed in a first region on the insulating layer to be brought into contact with the source electrode, and a drain electrode pad disposed in a second region separated from the first region on the insulating layer and brought into contact with the plurality of via contacts contacting the drain electrode.

20 Claims, 6 Drawing Sheets

POWER SEMICONDUCTOR DEVICE

CROSS-REFERENCE TO RELATED APPLICATION

This application claims the benefit of Korean Patent Application No. 10-2011-074686, filed on Jul. 27, 2011, in the Korean Intellectual Property Office, the disclosure of which is incorporated herein by reference.

BACKGROUND

1. Field of the Invention

The present invention relates to a power semiconductor device, and more particularly, to a power semiconductor device having an electrode structure for increasing a breakdown voltage by achieving an equipotential state in an electrode contact area and also for achieving a high withstand voltage.

2. Description of the Related Art

Conventionally, a power semiconductor device is made of silicon. However, since silicon has a limit in terms of physical properties, a power semiconductor device using a gallium nitride (GaN)-based material is being newly developed. The GaN-based material has an energy gap that is almost 3 times greater than an energy gap of silicon. Also, the GaN-based material has improved properties such as, high thermal and chemical stability, high electron saturation velocity, and the like. Therefore, the GaN-based material is applicable to not only an optical device but also an electronic device for achieving high frequency and high output.

Electronic devices including the GaN-based material have a high breakdown voltage, high maximum current density, and high operational stability and high heat conductivity at a high temperature. In particular, electronic devices having a hetero junction structure of aluminum gallium nitride (Al-GaN) and GaN has high band discontinuity at a junction interface. Thus, such an electronic device may free high density electrons and increase electron mobility.

Due to the foregoing physical property, the electronic device including the GaN-based material may be applied as a power semiconductor device. For this purpose, the power semiconductor device needs to maintain a high withstand voltage without reaching the breakdown voltage even under a high voltage. However, it is difficult for the power semiconductor device including the GaN-based material to endure withstand voltage due to bulk defects, surface defects, and the like.

SUMMARY

An aspect of the present invention provides a power semiconductor device for increasing a breakdown voltage and achieving a high withstand voltage by arranging electrodes such that an equipotential state is achieved in a device area.

According to an aspect of the present invention, there is provided a source electrode disposed on a device activation region and widened in a direction toward a first side, a drain electrode arranged alternately with the source electrode on the device activation region and widened in a direction toward a second side facing the first side, an insulating layer disposed on the source electrode and the drain electrode and configured to include a plurality of via contacts contacting the source electrode and the drain electrode, a source electrode pad disposed in a first region on the insulating layer to be brought into contact with the source electrode, and a drain electrode pad disposed in a second region separated from the first region on the insulating layer and brought into contact with the plurality of via contacts contacting the drain electrode.

The power semiconductor device may further include a gate electrode connected with a plurality of gate electrode lines disposed between the source electrode and the drain electrode on the device activation region, and disposed in at least one side of the device activation region; and a gate electrode pad disposed in a third region separated from the first region and the second region on the device activation region, and connected with the plurality of via contacts contacting the gate electrode.

The insulating layer may include a plurality of first via holes to expose the source electrode disposed in the first region; a plurality of second via holes to expose the drain electrode disposed in the second region; and a plurality of third via holes to expose the gate electrode disposed in the third region.

The insulating layer may include a plurality of first via contacts disposed in the plurality of first via holes to be brought into the source electrode, and connected with the source electrode pad; a plurality of second via contacts disposed in the plurality of second via holes to be brought into the drain electrode, and connected with the drain electrode pad; and a plurality of third via contacts disposed in the plurality of third via holes to be brought into the gate electrode, and connected with the gate electrode pad.

The plurality of first via holes may have a trapezoid shape widening in a direction toward the first side in the first region, corresponding to the widening structure of the source electrode.

The plurality of second via holes may have a trapezoid shape widening in a direction toward the second side in the second region, corresponding to the widening structure of the drain electrode.

The device activation region may include a buffer layer, an undoped nitride semiconductor layer, and a nitride semiconductor layer which are sequentially disposed on the substrate.

The nitride semiconductor layer may include a first nitride semiconductor layer disposed on the undoped nitride semiconductor layer; and a second nitride semiconductor layer disposed on the first nitride semiconductor layer.

The first nitride semiconductor layer may include aluminum nitride (AlN), and the second nitride semiconductor layer may include aluminum gallium nitride (AlGaN).

The source electrode, the drain electrode, and the gate electrode may include at least one metallic material selected from nickel (Ni), Al, titanium (Ti), titanium nitride (TiN), platinum (Pt), gold (Au), ruthenium dioxide ($RuO_2$), vanadium (V), tungsten (W), tungsten nitride (WN), hafnium (Hf), hafnium nitride (HfN), molybdenum (Mo), nickel silicide (NiSi), cobalt silicide ($CoSi_2$), tungsten silicide ($WSi_2$), platinum silicide (PtSi), iridium (Ir), zirconium (Zr), tantalum (Ta), tantalum nitride (TaN), copper (Cu), ruthenium (Ru), and cobalt (Co).

According to another aspect of the present invention, there is provided a power semiconductor device including an anode electrode disposed on an epi structure and configured to be widened in a direction toward a first side; a drain electrode disposed on the epi structure and arranged alternately with the anode electrode, and widened in a direction toward a second side facing the first side; an insulating layer disposed on the anode electrode and the cathode electrode and configured to include a plurality of via contacts in contact with the anode electrode and the cathode electrode; an anode electrode pad disposed in a first region on the insulating layer to be brought into contact with the via contact in contact with the anode electrode; and a cathode electrode pad disposed in a second region separated from the first region on the insulating layer, and connected with the via contact in contact with the cathode electrode.

The insulating layer may include a plurality of first via holes to expose the anode electrode disposed in the first region; and a plurality of second via holes to expose the cathode electrode disposed in the second region.

The insulating layer may include a plurality of first via contacts disposed in the plurality of first via holes to be brought into the anode electrode, and connected with the anode electrode pad; and a plurality of second via contacts disposed in the plurality of second via holes to be brought into the cathode electrode, and connected with the cathode electrode pad.

The plurality of first via holes may be provided in a shape of a trapezoid widening in a direction toward the first side in the first region, corresponding to the widening structure of the anode electrode.

The plurality of second via holes may be provided in a shape of a trapezoid widening in a direction toward the second side in the second region, corresponding to the widening structure of the cathode electrode.

The epi structure may include a buffer layer, an undoped nitride semiconductor layer, a nitride semiconductor layer, and a cap layer which are sequentially disposed on the substrate.

The anode electrode may be bonded to the cap layer, and the cathode electrode may be disposed on the nitride semiconductor layer exposed through the cap layer and separated from the anode electrode by a predetermined distance.

The nitride semiconductor layer may include a first nitride semiconductor layer disposed on the undoped nitride semiconductor layer; and a second nitride semiconductor layer disposed on the first nitride semiconductor layer.

The first nitride semiconductor layer may include AlN; and the second nitride semiconductor layer may include AlGaN.

The anode electrode and the cathode electrode may include at least one metallic material selected from Ni, Al, Ti, TiN, Pt, Au, $RuO_2$, V, W, WN, Hf, HfN, Mo, NiSi, $CoSi_2$, $WSi_2$, PtSi, Ir, Zr, Ta, TaN, Cu, Ru, and Co.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
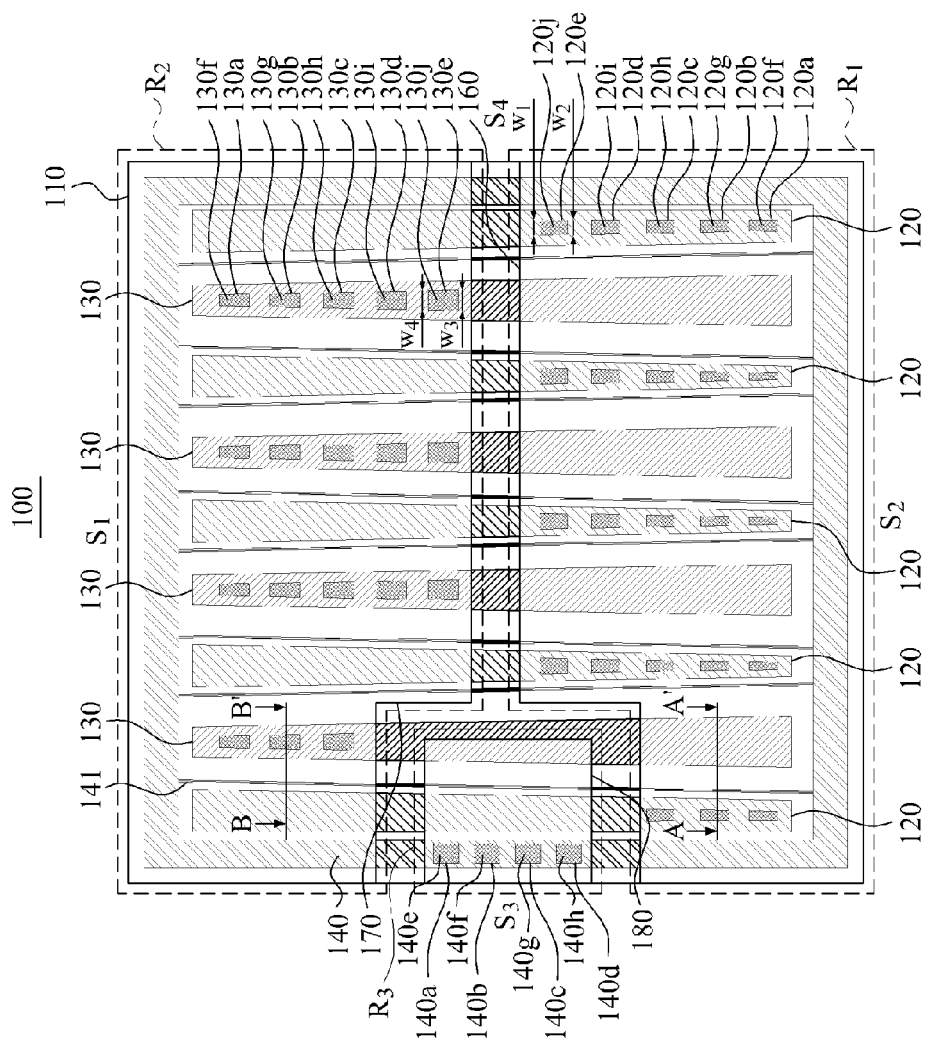
FIG. 1 is a diagram illustrating an electrode structure of a power semiconductor device according to an embodiment of the present invention.

Reference will now be made in detail to exemplary embodiments of the present invention, examples of which are illustrated in the accompanying drawings, wherein like reference numerals refer to the like elements throughout. In the following description, when it is determined that a detailed description of well-known functions related to the present invention and the construction thereof would make the spirit of the present invention obscure, they will be omitted. The terminology used herein is for the purpose of describing particular embodiments only and the definition may be varied according to the intention of a user, an operator, or customs. Therefore, the terms and words should be defined based on a description of this specification.

FIG. 1 is a diagram illustrating an electrode structure of a power semiconductor device 100 according to an embodiment of the present invention.

Referring to FIG. 1, the power semiconductor device 100 may be a hetero junction field effect transistor (HFET) including a source electrode 120, a drain electrode 130, a gate electrode 140, an insulating layer (not shown), a source electrode pad 160, a drain electrode pad 170, and a gate electrode pad 180, which are disposed in a device activation region 110. The source electrode 120, the drain electrode 130, and the gate electrode 140 are disposed in the device activation region 110. As shown in FIG. 1, the device activation region 110 may include a first side $s_1$ and a second side $s_2$ facing each other, and a third side $s_3$ and a fourth side $s_4$ vertically connected to the first side $s_1$ and the second side $s_2$, respectively, while facing each other.

The source electrode 120 may have a plurality of finger structures extended from the second side $s_2$ to the first side $s_1$. In addition, the source electrode 120 is widened in a direction toward the first side $s_1$.

The drain electrode 130 may have a plurality of finger structures arranged alternately with and at a predetermined distance from the finger structures of the source electrode 120. The finger structures of the drain electrode 130 may be extended from the first side $s_1$ toward the second side $s_2$ and widened in a direction toward the second side $s_2$.

The gate electrode 140 may be disposed in at least one side of the device activation region 110. Specifically, the gate electrode 140 may be separated from the source electrode 120 and the drain electrode 130 by a predetermined distance, and disposed in at least one of the first side $s_1$ to the fourth side $s_4$ of the device activation region 110. In FIG. 1, the gate electrode 140 is disposed in an area from the first side $s_1$ to the fourth side $s_4$ and has a closed circuit structure.

Additionally, the gate electrode 140 may be connected to a plurality of gate electrode lines 141 disposed between the source electrode 120 and the drain electrode 130. The plurality of gate electrode lines 141 may be disposed adjacent to the respective finger structures of the source electrode 120.

The source electrode 120, the drain electrode 130, and the gate electrode 140 may include at least one metallic material selected from nickel (Ni), Al, titanium (Ti), titanium nitride (TiN), platinum (Pt), gold (Au), ruthenium dioxide ($RuO_2$), vanadium (V), tungsten (W), tungsten nitride (WN), hafnium (Hf), hafnium nitride (HfN), molybdenum (Mo), nickel silicide (NiSi), cobalt silicide ($CoSi_2$), tungsten silicide ($WSi_2$), platinum silicide (PtSi), iridium (Ir), zirconium (Zr), tantalum (Ta), tantalum nitride (TaN), copper (Cu), ruthenium (Ru), and cobalt (Co).

Sizes of each of the source electrode 120, the drain electrode 130, and the gate electrode 140 may be varied according to a size of the power semiconductor device 100. That is, since a required breakdown voltage or withstand voltage varies according to the size of the power semiconductor device 100, the sizes of the source electrode 120, the drain electrode 130, and the gate electrode 140 may be varied accordingly.

Although not shown, the insulating layer may be disposed on the device activation region 110 to cover the source electrode 120, the drain electrode 130, and the gate electrode 140, thereby insulating the source electrode 120, the drain electrode 130, and the gate electrode 140. A structure of the insulating layer will be described with reference to FIGS. 2 and 3 which are sectional views of FIG. 1.

The insulating layer includes a plurality of via holes, and a plurality of via contacts respectively filling the plurality of via holes.

An upper surface of the insulating layer may be divided into a first region $R_1$, a second region $R_2$, and a third region $R_3$. First, the upper surface of the insulating layer is divided into the first region $R_1$ and the second region $R_2$ with respect to a central line between the first side $s_1$ and the second side $s_2$. In addition, a region of the upper surface, in which the gate electrode 140 is disposed, may be defined as the third region $R_3$. The first region $R_1$ to the third region $R_3$ may be defined not to overlap one another.

The insulating layer includes a plurality of via holes 120a, 120b, 120c, 120d, and 120e exposing the source electrode 120 disposed in the first region $R_1$, a plurality of second via holes 130a, 130b, 130c, 130d, and 130e exposing the drain electrode 130 disposed in the second region $R_2$, and a plurality of third via holes 140a, 140b, 140c, 140d, and 140e exposing the gate electrode 140 disposed in the third region $R_3$.

The plurality of first via holes 120a to 120e are provided a shape of a trapezoid widening in a direction toward the first side $s_1$ in the first region $R_1$, corresponding to the widening structure of the source electrode 120. The plurality of second via holes 130a to 130e are provided in a shape of a trapezoid widening in a direction toward the second side $s_2$ in the second region $R_2$, corresponding to the widening structure of the drain electrode 130. The plurality of third via holes 140a to 140d are provided in a shape of a rectangle or square having a uniform width in the third region $R_3$.

The insulating layer may include first via contacts 120f, 120g, 120h, 120i, and 120j respectively disposed in the plurality of first via holes 120a to 120e, second via contacts 130f, 130g, 130h, 130i, and 130j respectively disposed in the plurality of second via holes 130a to 130e, and a plurality of third via contacts 140e, 140f, 140g, and 140h respectively disposed in the plurality of third via holes 140a to 140d. The pluralities of first via contacts 120f to 120j, second via contacts 130f to 130j, and third via contacts 140e to 140h may be exposed through the upper surface of the insulating layer.

The plurality of first via contacts 120f to 120j may be formed in the first region $R_1$ and brought into contact with the source electrode 120. The plurality of second via contacts 130f to 130j may be formed in the second region $R_2$ and brought into contact with the drain electrode 130. The plurality of third via contacts 140e to 140h may be formed in the third region $R_3$ and brought into contact with the gate electrode 140.

The plurality of first via contacts 120f to 120j may have a shape corresponding to the shape of the plurality of first via holes 120a to 120e, that is, the trapezoid widening in a direction toward the first side $s_1$.

The plurality of second via contacts 130f to 130j may have a shape corresponding to the shape of the plurality of second via holes 130a to 130e, that is, the trapezoid shape widening in a direction toward the second side $s_2$.

In addition, the plurality of third via contacts 140e to 140h may have a shape corresponding to the shape of the plurality of third via holes 140a to 140d, that is, the rectangle or square having a uniform width in the third region $R_3$.

The source electrode pad 160 may be disposed in the first region $R_1$ on the insulating layer and connected with the plurality of first via contacts 120f to 120j contacting the source electrode 120. That is, the source electrode pad 160 may be electrically connected with the source electrode 120 through the plurality of first via contacts 120f to 120j.

The drain electrode pad 170 may be disposed in the second region $R_2$ on the insulating layer and connected with the plurality of second via contacts 130f to 130j contacting the drain electrode 130. That is, the drain electrode pad 170 may be electrically connected with the drain electrode 130 through the plurality of second via contacts 130f to 130j.

The gate electrode pad 180 may be disposed in the third region $R_3$ on the insulating layer and connected with the plurality of third via contacts 140e to 140h contacting the gate electrode 140. That is, the gate electrode pad 180 may be electrically connected with the gate electrode 140 and the plurality of gate electrode lines 141 through the plurality of third via contacts 140e to 140h.

Referring to the power semiconductor device 100 shown in FIG. 1, the source electrode 120 may be supplied with a voltage through the plurality of first via contacts 120f to 120j connected with the source electrode pad 160. In this case, a portion of the source electrode 120, which is disposed in the second region $R_2$, is supplied with the voltage not directly but instead through the plurality of first via contacts 120f to 120j disposed in the first region $R_1$.

The drain electrode 130 may be supplied with a voltage through the plurality of second via contacts 130f to 130j connected with the drain electrode pad 170. In this case, a portion of the drain electrode 130, which is disposed in the first region $R_1$, is supplied with the voltage not directly but instead through the plurality of second via contacts 130f to 130j disposed in the second region $R_2$.

When the source electrode 120 and the drain electrode 130 have a rectangular shape with a uniform width, a potential difference is generated between portions having the pluralities of first via contacts 120f to 120j and second via contacts 130f to 130j and portions not having the pluralities of first via contacts 120f to 120j and second via contacts 130f to 130j, in the source electrode 120 and the drain electrode 130.

Therefore, the source electrode 120 and the drain electrode 130 may be configured to be widened toward one side. More specifically, in the source electrode 120, the portion not having the plurality of first via contacts 120f to 120j may have a relatively greater width. In the drain electrode 130, the portion not having the plurality of second via contacts 130f to 130j may have a relatively greater width.

That is, in the source electrode 120 and the drain electrode 130, a surface area of a region not in direct contact with the pluralities of first via contacts 120f to 120j and second via contacts 130f to 130j is increased, to thereby compensate for the potential difference and achieve an equipotential state in the source electrode 120 and the drain electrode 130. As a result, the power semiconductor device 100 may achieve high breakdown voltage and high withstand voltage.

Figure 2:
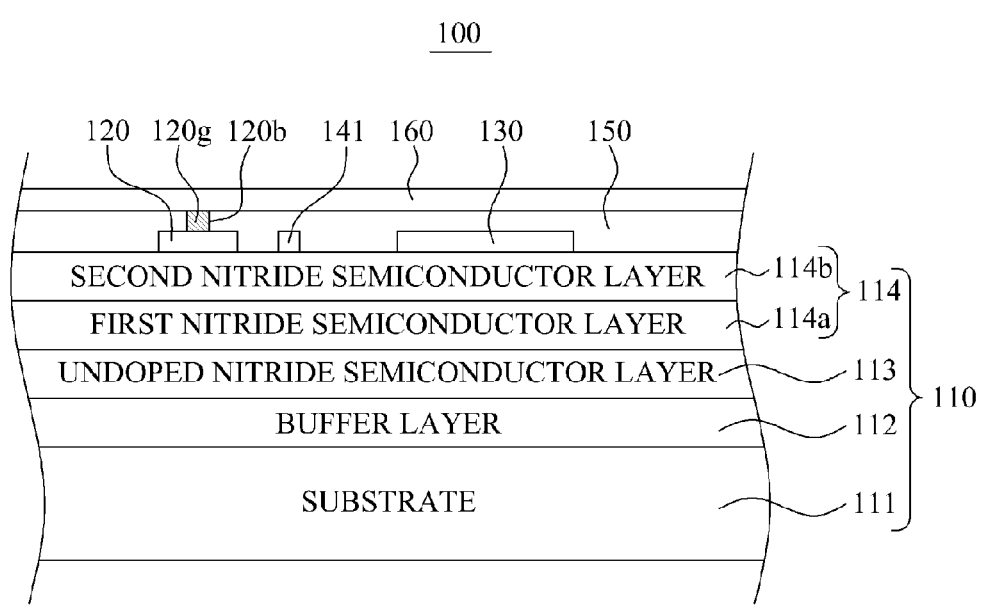
FIG. 2 is a sectional view of the power semiconductor device shown in FIG. 1, cut along a line A-A'.
Figure 3:
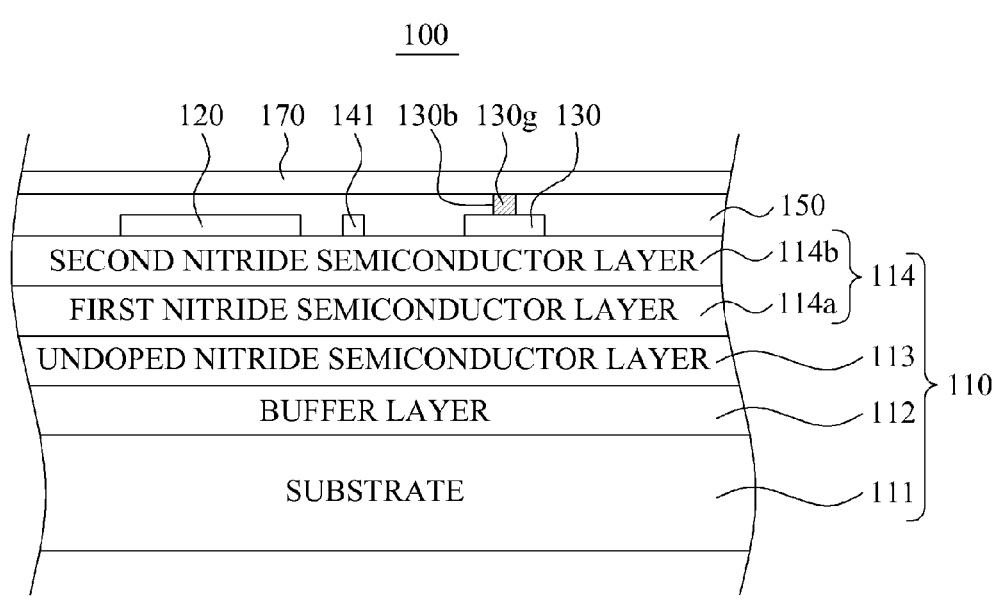
FIG. 3 is a sectional view of the power semiconductor device shown in FIG. 1, cut along a line B-B'.

FIG. 2 is a sectional view of the power semiconductor device 100 shown in FIG. 1, cut along a line A-A'. FIG. 3 is a sectional view of the power semiconductor device 100 cut along a line B-B'. Referring to FIGS. 2 and 3, the device activation region 110 includes a buffer layer 112, an undoped nitride semiconductor layer 113, and a nitride semiconductor layer 114, which are sequentially disposed on a substrate 111.

The buffer layer 112 may include gallium nitride (GaN). The undoped nitride semiconductor layer 113 may include undoped GaN.

The nitride semiconductor layer 114 may include a first nitride semiconductor layer 114a and a second nitride semiconductor layer 114b. The first nitride semiconductor layer 114a is disposed on the undoped nitride semiconductor layer 113 and includes aluminum nitride (AlN). The second nitride semiconductor layer 114b is disposed on the first nitride semiconductor layer 114a and includes aluminum gallium nitride (AlGaN). That is, the first nitride semiconductor layer 114a and the second nitride semiconductor layer 114b may be hetero junction semiconductor layers.

FIG. 2 is a sectional view of a region corresponding to the first region R1 of the power semiconductor device 100, cut along the line A-A'.

Referring to FIG. 2, the power semiconductor device 100 may include the source electrode 120, the plurality of gate electrode lines 141, and the drain electrode 130 which are disposed on an upper surface of the second nitride semiconductor layer 114b. In addition, the power semiconductor device 100 may further include an insulating layer 150 covering the source electrode 120, the plurality of gate electrode lines 141, and the drain electrode 130, and the source electrode pad 160 disposed on the insulating layer 150.

The source electrode 120, the plurality of gate electrode lines 141, and the drain electrode 130 are separated from one another. The insulating layer 150 is interposed among the source electrode 120, the plurality of gate electrode lines 141, and the drain electrode 130.

The insulating layer 150 includes a via hole 120b exposing the source electrode 120 in the first region R1, and a via contact 120g disposed in the via hole 120b and brought into contact with the via contact 120g.

The source electrode pad 160 is disposed on the insulating layer 150 and connected with the via contact 120g contacting the source electrode 120. The source electrode pad 160 may be electrically connected with an external circuit such as a lead frame, by a conductive material such as a wire. Accordingly, the voltage supplied to the source electrode pad 160 may be supplied to the source electrode 120 through the via contact 120g.

The drain electrode 130 may be electrically insulated in the first region R1 by the insulating layer 150. Thus, although the drain electrode 130 does not directly receive the voltage supply in the first region $R_1$, the drain electrode 130 may receive the voltage from the drain electrode pad 170 disposed in the second region $R_2$ by having a wide width, thereby compensating for the potential difference. Accordingly, the drain electrode 130 may achieve the equipotential state in the first region $R_1$ and the second region $R_2$.

FIG. 3 is a sectional view of a part of a region corresponding to the second region $R_2$ in the power semiconductor device 100 shown in FIG. 1, cut along a line B-B'.

Referring to FIG. 3, the device activation region 110 has such a structure as shown in FIG. 2. Additionally, the power semiconductor device 100 includes the source electrode 120, the gate electrode line 141, and the drain electrode 130 which are disposed on an upper surface of the second nitride semiconductor layer 114b. In addition, the power semiconductor device 100 may include the insulating layer 150 disposed to cover the source electrode 120, the gate electrode line 141, and the drain electrode 130, and the drain electrode pad 170 disposed on an upper portion of the insulating layer 150.

The insulating layer 150 may include the via hole 130b configured to expose the drain electrode 130 in the second region $R_2$, and the via contact 130g disposed in the via hole 130b and brought into contact with the drain electrode 130.

The drain electrode pad 170 may be disposed on the insulating layer 150 and connected with the via contact 130g contacting the drain electrode 130. The drain electrode pad 170 may be electrically connected with an external circuit such as a lead frame, by a conductive material such as a wire. Accordingly, the voltage supplied to the drain electrode pad 170 may be supplied to the drain electrode 130 through the via contact 130g.

The source electrode 120 may be electrically insulated by the insulating layer 150 in the second region $R_2$. Therefore, although the source electrode 120 does not directly receive the voltage supply in the second region $R_2$, the source electrode 120 may receive the voltage from the source electrode 120 disposed in the first region $R_1$ by having a wide width, thereby compensating for the potential difference. Accordingly, the source electrode 120 may achieve the equipotential state in the first region $R_1$ and the second region $R_2$.

Figure 4:
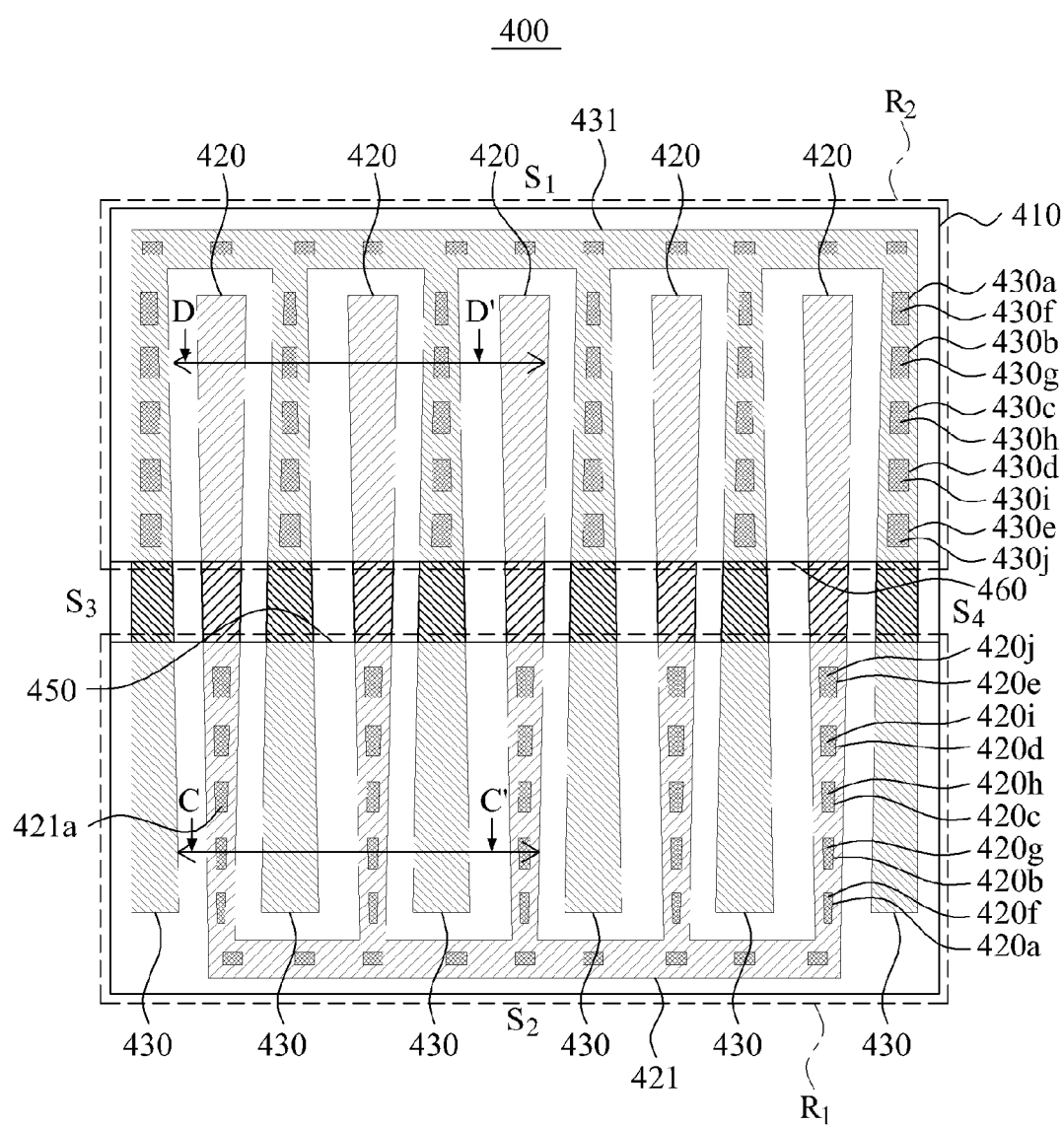
FIG. 4 is a plan view illustrating an electrode structure of a power semiconductor device according to another embodiment of the present invention.

FIG. 4 is a plan view illustrating an electrode structure of a power semiconductor device 400 according to another embodiment of the present invention. Referring to FIG. 4, the power semiconductor device 400 may be a hetero junction Schottky barrier diode (SBD) including an anode electrode 420, a cathode electrode 430, an insulating layer, an anode electrode pad 450, and a cathode electrode pad 460 which are disposed on an epi structure 410.

The anode electrode 420 and the cathode electrode 430 are disposed on the epi structure 410. As shown in FIG. 4, the epi structure 410 includes a first side $s_1$ and a second side $s_2$ facing each other, and a third side $s_3$ and a fourth side $s_4$ vertically connected to the first side $s_1$ and the second side $s_2$, respectively, while facing each other.

The anode electrode 420 may have a plurality of finger structures extended from the second side $s_2$ to the first side $s_1$. In addition, the anode electrode 420 is widened in a direction toward the first side $s_1$. The anode electrode 420 may be connected with an anode connection lead 421 disposed along the second side $s_2$.

The cathode electrode 430 may have a plurality of finger structures arranged alternately with and at a predetermined distance from the finger structures of the anode electrode 420. The finger structures of the cathode electrode 430 may be extended from the first side $s_1$ toward the second side $s_2$ and widened in a direction toward the second side $s_2$. The cathode electrode 430 may be connected with a cathode connection lead 431 disposed along the first side $s_1$.

The anode electrode 420 and the cathode electrode 430 may include at least one metallic material selected from Ni, Al, Ti, TiN, Pt, Au, $RuO_2$, V, W, WN, Hf, HfN, Mo, NiSi, $CoSi_2$, $WSi_2$, PtSi, Ir, Zr, Ta, TaN, Cu, Ru, and Co.

Although not shown in FIG. 4, an insulating layer may be provided on the epi structure 410 to cover and therefore insulate the anode electrode 420 and the cathode electrode 430. A structure of the insulating layer will be illustrated and described with reference to FIGS. 5 and 6 that are sectional views of FIG. 4.

The insulating layer includes a plurality of via holes, and a plurality of via contacts filling in the respective via holes.

An upper surface of the insulating layer may be divided into a first region $R_1$ and a second region $R_2$. Here, the upper surface of the insulating layer may be divided into the first region $R_1$ and the second region $R_2$ with respect to a central line between the first side $s_1$ and the second side $s_2$.

The insulating layer may include a plurality of first via holes 420a, 420b, 420dc, 420d, and 420e exposing the anode electrode 420 disposed in the first region $R_1$, and a plurality of second via holes 430a, 430b, 430c, 430d, and 430e exposing the cathode electrode 430 disposed in the second region $R_2$.

The plurality of first via holes 420a to 420e may have a trapezoid shape widening in a direction toward the first side $s_1$ in the first region $R_1$, corresponding to the widening structure of the anode electrode 420. Also, the plurality of second via holes 430*a* to 430*e* may be provided in a shape of a trapezoid widening in a direction toward the second side $s_2$ in the second region $R_2$, corresponding to the widening structure of the cathode electrode 430.

Additionally, the insulating layer may include a plurality of first via contacts 420*f*, 420*g*, 420*h*, 420*i*, and 420*j* respectively disposed in the plurality of first via holes 420*a* to 420*e*, and a plurality of second via contacts 430*f*, 430*g*, 430*h*, 430*i*, and 430*j* respectively disposed in the plurality of second via holes 430*a* to 430*e*. The pluralities of the first via contacts 420*f* to 420*j* and second via contacts 430*f* to 430*j* may be exposed through the upper surface of the insulating layer.

The plurality of first via contacts 420*f* to 420*j* are disposed in the first region $R_1$ and brought into contact with the anode electrode 420. The plurality of second via contacts 430*f* to 430*j* are disposed in the second region R2 and brought into contact with the cathode electrode 430.

The plurality of first via contacts 420*f* to 420*j* have a shape corresponding to the plurality of first via holes 420*a* to 420*e*, that is, the trapezoid widening in a direction toward the first side $s_1$. The plurality of second via contacts 430*f* to 430*j* have a shape corresponding to the shape of the plurality of second via holes 430*a* to 430*e*, that is, the trapezoid widening in a direction toward the second side $s_2$. That is, a contact area between the the plurality of first via contacts 420*f* to 420*j* and the anode electrode 420 increases in a direction toward the first side $s_1$. A contact area between the plurality of second via contacts 430*f* to 430*j* and the cathode electrode 430 increases in a direction toward the second side $s_2$.

The anode electrode pad 450 is disposed in the first region $R_1$ on the insulating layer and connected with the plurality of first via contacts 420*f* to 420*j* contacting the anode electrode 420. That is, the anode electrode pad 450 may be electrically connected with the anode electrode 420 through the plurality of first via contacts 420*f* to 420*j*.

The cathode electrode pad 460 is disposed in the second region $R_2$ on the insulating layer and connected with the plurality of second via contacts 430*f* to 430*j*. That is, the cathode electrode pad 460 may be electrically connected with the cathode electrode 430 through the plurality of second via contacts 430*f* to 430*j*.

Referring to the power semiconductor device 400 shown in FIG. 4, the anode electrode 420 may be supplied with a voltage through the plurality of first via contacts 420*f* to 420*j* connected with the anode electrode pad 450. In this case, a portion of the anode electrode 420, which is disposed in the second region $R_2$, is supplied with the voltage not directly but through the plurality of first via contacts 420*f* to 420*j* disposed in the first region $R_1$.

The cathode electrode 430 may be supplied with the voltage through the plurality of second via contacts 430*f* to 430*j* connected with the cathode electrode pad 460. In this case, a portion of the cathode electrode 430, which is disposed in the first region $R_1$, is supplied with the voltage not directly but through the plurality of second via contacts 430*f* to 430*j* disposed in the second region $R_2$.

When the anode electrode 420 and the cathode electrode 430 are provided in a shape of a rectangle with a uniform width, a potential difference is generated between portions having the pluralities of first via contacts 420*f* to 420*j* and second via contacts 430*f* to 430*j* and portions not having the pluralities of first via contacts 420*f* to 420*j* and second via contacts 430*f* to 430*j*, in the anode electrode 420 and the cathode electrode 430.

Specifically, in the anode electrode 420 and the cathode electrode 430, the portions not having the pluralities of the first via contacts 420*f* to 420*j* and second via contacts 430*f* to 430*j* may have a relatively lower potential. Due to such a potential difference, the power semiconductor device 400 may quickly reach the breakdown voltage while having a low withstand voltage. To overcome this, the anode electrode 420 and the cathode electrode 430 may be configured to be widened in a direction toward one side as shown in FIG. 4.

More specifically, in the anode electrode 420, the portions not having the plurality of first via contacts 420*f* to 420*j* may have a relatively greater width. In the cathode electrode 430, a portion not having the plurality of second via contacts 430*f* to 430*j* may have a relatively greater width. That is, the potential difference may be compensated for by increasing a surface area of the portion not directly contacting the plurality of first via contacts 420*f* to 420*j* and the plurality of second via contacts 430*f* to 430*j* in the anode electrode 420 and the cathode electrode 430. Therefore, an equipotential state may be achieved in the anode electrode 120 and the cathode electrode 130. As a result, the power semiconductor device 400 may achieve high breakdown voltage and high withstand voltage.

Figure 5:
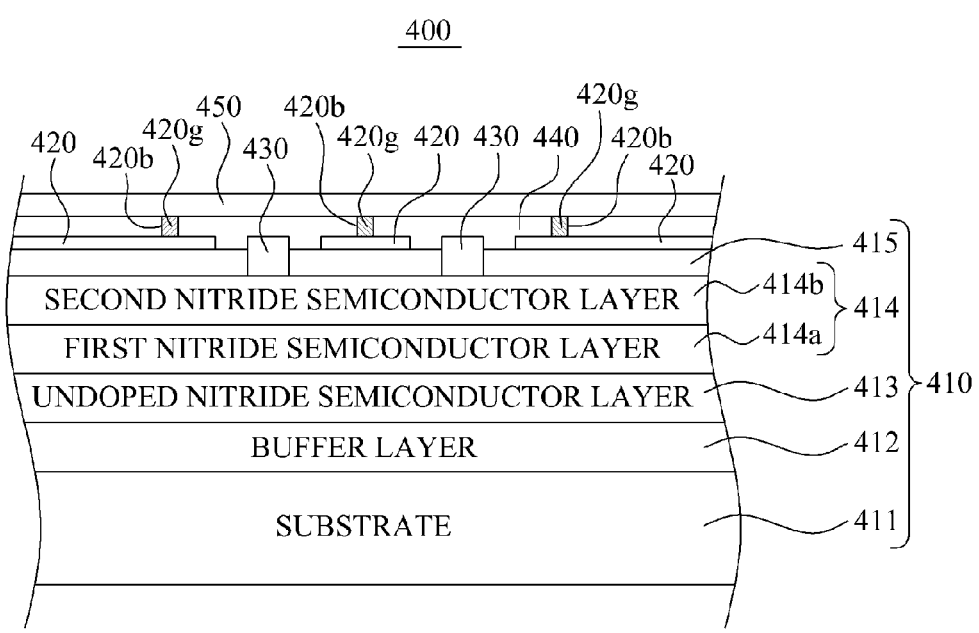
FIG. 5 is a sectional view of the power semiconductor device shown in FIG. 4, cut along a line C-C.
Figure 6:
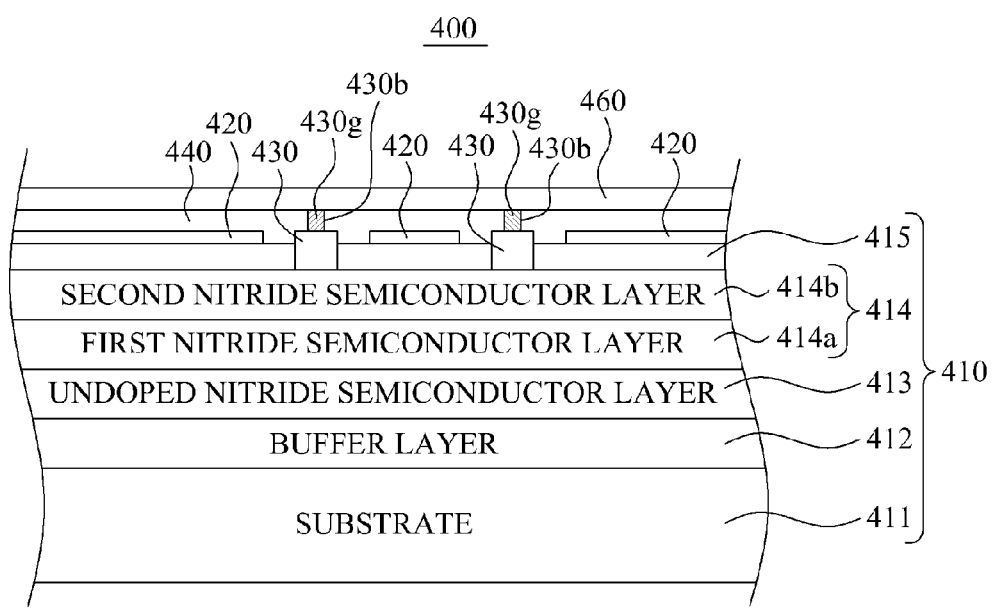
FIG. 6 is a sectional view of the power semiconductor device shown in FIG. 4, cut along a line D-D'.

FIG. 5 is a sectional view of the power semiconductor device shown in FIG. 4, cut along a line C-C'. FIG. 6 is a sectional view of the power semiconductor device shown in FIG. 4, cut along a line D-D'.

Referring to FIGS. 5 and 6, the epi structure 410 may include a substrate 411 such as a silicon (Si) substrate, a silicon carbide (SiC) substrate, an AlN substrate, a GaN substrate, or a sapphire substrate. In addition, the epi structure 410 includes a buffer layer 412, an updoped nitride semiconductor layer 413, a nitride semiconductor layer 414, and a cap layer 415 which are sequentially disposed on the substrate.

In the epi structure, the buffer layer 412 may include GaN and the undoped nitride semiconductor layer 413 may include undoped GaN.

The nitride semiconductor layer 414 may include a first nitride semiconductor layer 414*a* and a second nitride semiconductor layer 414*b*. The first nitride semiconductor layer 414*a* may be disposed on the undoped nitride semiconductor layer 413, and include AlN. The second nitride semiconductor layer 414*b* may be disposed on the first nitride semiconductor layer 414*a*, and include AlGaN. That is, the first nitride semiconductor layer 414*a* and the second nitride semiconductor layer 414*b* may be hetero junction semiconductor layers.

The cap layer 415 is disposed on the nitride semiconductor layer 414, in particular, the second nitride semiconductor layer 414*b*. The cap layer 415 may include SiC, GaN, or p-type GaN. In addition, the cap layer 415 is disposed only in a region for forming the anode electrode 420 and an insulating layer 440, on the second nitride semiconductor layer 414*b*. In other words, the cap layer 415 is not formed on a region for forming the cathode electrode 430 on the second nitride semiconductor layer 414*b*. Therefore, the second nitride semiconductor layer 414*b* may be exposed through the cap layer 415 in the region for forming the cathode electrode 430.

FIG. 5 is a sectional view of a part of a region corresponding to the first electrode $R_1$ in the power semiconductor device 400 shown in FIG. 4, cut along a line C-C'.

Referring to FIG. 5, the power semiconductor device 400 includes the anode electrode 420 and the cathode electrode 430 disposed on the upper surface of the epi structure 410. In addition, the power semiconductor device 400 includes the insulating layer 440 covering the anode electrode 420 and the cathode electrode 430, and an anode electrode pad 450 disposed at an upper portion of the insulating layer 440.

The anode electrode 420 and the cathode electrode 430 are separated from each other. The insulating layer 440 is interposed between the anode electrode 420 and the cathode electrode 430. The insulating layer 440 may include a plurality of the via holes 420b exposing the anode electrode 420 in the first region $R_1$, and a plurality of the via contacts 420g disposed in the plurality of via holes 420b and brought into contact with the anode electrode 420.

The anode electrode pad 450 is disposed on the insulating layer 440 and connected with the plurality of via contacts 420g contacting the anode electrode 420. The anode electrode pad 450 may be electrically connected with an external pattern such as a lead frame by a conductive material such as a wire. Accordingly, the voltage supplied to the anode electrode pad 450 may be supplied to the anode electrode 420 through the plurality of via contacts 420g.

The anode electrode 420 is electrically insulated by the insulating layer 440 in the second region $R_2$. Therefore, the anode electrode 420 does not directly receive the voltage in the second region $R_2$. However, the anode electrode 420 may receive the voltage from the plurality of via contacts 420g disposed in the first region $R_1$ by having a wide width when compared to the first region $R_1$, thereby compensating for the potential difference. Accordingly, the anode electrode 420 may achieve the equipotential state in the first region $R_1$ and the second region $R_2$.

FIG. 6 is a sectional view of a part of a region corresponding to the second electrode $R_2$ in the power semiconductor device 400 shown in FIG. 4, cut along a line D-D'.

Referring to FIG. 6, the epi structure 410 has almost the same structure as shown in FIG. 5. In addition, the power semiconductor device 400 may include the anode electrode 420 and the cathode electrode 430 disposed at the upper surface of the epi structure 410. In addition, the power semiconductor device 400 may include the insulating layer 440 covering the anode electrode 420 and the cathode electrode 430, and the cathode electrode pad 460 disposed at the upper portion of the insulating layer 440.

The anode electrode 420 and the cathode electrode 430 are separated from each other. The insulating layer 440 is interposed between the anode electrode 420 and the cathode electrode 430. The insulating layer 440 may include a plurality of the via holes 430b exposing the cathode electrode 430 in the second region $R_2$, and a plurality of the via contacts 430g disposed in the plurality of via holes 430b and brought into contact with the cathode electrode 430.

The cathode electrode pad 460 may be disposed on the insulating layer 440 and connected with the plurality of via contacts 430g contacting the cathode electrode 430. The cathode electrode pad 460 may be electrically connected with an external pattern such as a lead frame by a conductive material such as a wire. Therefore, the voltage supplied to the cathode electrode pad 460 may be supplied to the cathode electrode 430 through the plurality of via contacts 430g.

In the first region $R_1$, the cathode electrode 430 is electrically insulated by the insulating layer 440. Therefore, the cathode electrode 430 does not directly receive the voltage in the first region $R_1$. However, the cathode electrode 430 may receive the voltage from the plurality of via contacts 430g disposed in the second region $R_2$ by having a wide width in comparison with the second region $R_2$, thereby compensating for the potential difference. Accordingly, the cathode electrode 430 may achieve the equipotential state in the first region $R_1$ and the second region $R_2$.

According to the embodiments of the present invention, electrodes are arranged so as to achieve an equipotential state in a device region. Therefore, the power semiconductor device may have high breakdown voltage and high withstand voltage. As a result, damage and malfunction caused by the breakdown voltage may be reduced and reliability of the power semiconductor device is increased.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A power semiconductor device comprising:
    a source electrode disposed on a device activation region and widened in a direction toward a first side;
    a drain electrode arranged alternately with the source electrode on the device activation region and widened in a direction toward a second side facing the first side;
    an insulating layer disposed on the source electrode and the drain electrode and configured to comprise a plurality of via contacts contacting the source electrode and the drain electrode;
    a source electrode pad disposed in a first region on the insulating layer to be brought into contact with the source electrode; and
    a drain electrode pad disposed in a second region separated from the first region on the insulating layer and brought into contact with the plurality of via contacts contacting the drain electrode.

2. The power semiconductor device of claim 1, further comprising:
    a gate electrode connected with a plurality of gate electrode lines disposed between the source electrode and the drain electrode on the device activation region, and disposed in at least one side of the device activation region; and
    a gate electrode pad disposed in a third region separated from the first region and the second region on the device activation region, and connected with the plurality of via contacts contacting the gate electrode.

3. The power semiconductor device of claim 2, wherein the insulating layer comprises:
    a plurality of first via holes to expose the source electrode disposed in the first region;
    a plurality of second via holes to expose the drain electrode disposed in the second region; and
    a plurality of third via holes to expose the gate electrode disposed in the third region.

4. The power semiconductor device of claim 3, wherein the insulating layer comprises:
    a plurality of first via contacts disposed in the plurality of first via holes to be brought into the source electrode, and connected with the source electrode pad;
    a plurality of second via contacts disposed in the plurality of second via holes to be brought into the drain electrode, and connected with the drain electrode pad; and
    a plurality of third via contacts disposed in the plurality of third via holes to be brought into the gate electrode, and connected with the gate electrode pad.

5. The power semiconductor device of claim 3, wherein the plurality of first via holes are provided in a shape of a trapezoid widening in a direction toward the first side in the first region, corresponding to the widening structure of the source electrode.

6. The power semiconductor device of claim 3, wherein the plurality of second via holes are provided in a shape of a trapezoid widening in a direction toward the second side in the second region, corresponding to the widening structure of the drain electrode.

7. The power semiconductor device of claim 1, wherein the device activation region comprises a buffer layer, an undoped nitride semiconductor layer, and a nitride semiconductor layer which are sequentially disposed on the substrate.

8. The power semiconductor device of claim 7, wherein the nitride semiconductor layer comprises:
   a first nitride semiconductor layer disposed on the undoped nitride semiconductor layer; and
   a second nitride semiconductor layer disposed on the first nitride semiconductor layer.

9. The power semiconductor device of claim 8, wherein the first nitride semiconductor layer comprises aluminum nitride (AlN), and
   the second nitride semiconductor layer comprises aluminum gallium nitirde (AlGaN).

10. The power semiconductor device of claim 1, wherein the source electrode, the drain electrode, and the gate electrode comprise at least one metallic material selected from nickel (Ni), Al, titanium (Ti), titanium nitride (TiN), platinum (Pt), gold (Au), ruthenium dioxide ($RuO_2$), vanadium (V), tungsten (W), tungsten nitride (WN), hafnium (Hf), hafnium nitride (HfN), molybdenum (Mo), nickel silicide (NiSi), cobalt silicide ($CoSi_2$), tungsten silicide ($WSi_2$), platinum silicide (PtSi), iridium (Ir), zirconium (Zr), tantalum (Ta), tantalum nitride (TaN), copper (Cu), ruthenium (Ru), and cobalt (Co).

11. A power semiconductor device comprising:
   an anode electrode disposed on an epi structure and configured to be widened in a direction toward a first side;
   a drain electrode disposed on the epi structure and arranged alternately with the anode electrode, and widened in a direction toward a second side facing the first side;
   an insulating layer disposed on the anode electrode and the cathode electrode and configured to comprise a plurality of via contacts in contact with the anode electrode and the cathode electrode;
   an anode electrode pad disposed in a first region on the insulating layer to be brought into contact with the via contact in contact with the anode electrode; and
   a cathode electrode pad disposed in a second region separated from the first region on the insulating layer, and connected with the via contact in contact with the cathode electrode.

12. The power semiconductor device of claim 11, wherein the insulating layer comprises:
   a plurality of first via holes to expose the anode electrode disposed in the first region; and
   a plurality of second via holes to expose the cathode electrode disposed in the second region.

13. The power semiconductor device of claim 12, wherein the insulating layer comprises:
   a plurality of first via contacts disposed in the plurality of first via holes to be brought into the anode electrode, and connected with the anode electrode pad; and
   a plurality of second via contacts disposed in the plurality of second via holes to be brought into the cathode electrode, and connected with the cathode electrode pad.

14. The power semiconductor device of claim 12, wherein the plurality of first via holes are provided in a shape of a trapezoid widening in a direction toward the first side in the first region, corresponding to the widening structure of the anode electrode.

15. The power semiconductor device of claim 12, wherein the plurality of second via holes have a trapezoid shape widening in a direction toward the second side in the second region, corresponding to the widening structure of the cathode electrode.

16. The power semiconductor device of claim 11, wherein the epi structure comprises a buffer layer, an undoped nitride semiconductor layer, a nitride semiconductor layer, and a cap layer which are disposed on the substrate sequentially.

17. The power semiconductor device of claim 16, wherein the anode electrode is bonded to the cap layer, and
   the cathode electrode is disposed on the nitride semiconductor layer exposed through the cap layer and separated from the anode electrode by a predetermined distance.

18. The power semiconductor device of claim 16, wherein the nitride semiconductor layer comprises:
   a first nitride semiconductor layer disposed on the undoped nitride semiconductor layer; and
   a second nitride semiconductor layer disposed on the first nitride semiconductor layer.

19. The power semiconductor device of claim 18, wherein the first nitride semiconductor layer comprises aluminum nitride (AlN); and
   the second nitride semiconductor layer comprises aluminum gallium nitride (AlGaN).

20. The power semiconductor device of claim 11, wherein the anode electrode and the cathode electrode comprise at least one metallic material selected from nickel (Ni), Al, titanium (Ti), titanium nitride (TiN), platinum (Pt), gold (Au), ruthenium dioxide ($RuO_2$), vanadium (V), tungsten (W), tungsten nitride (WN), hafnium (Hf), hafnium nitride (HfN), molybdenum (Mo), nickel silicide (NiSi), cobalt silicide ($CoSi_2$), tungsten silicide ($WSi_2$), platinum silicide (PtSi), iridium (Ir), zirconium (Zr), tantalum (Ta), tantalum nitride (TaN), copper (Cu), ruthenium (Ru), and cobalt (Co).

* * * * *